United States Patent
Chen et al.

(10) Patent No.: US 9,274,200 B2
(45) Date of Patent: Mar. 1, 2016

(54) FREQUENCY DETECTION CIRCUITS, RADIO FREQUENCY SIGNAL PROCESSING DEVICES AND METHODS FOR CALIBRATING INDUCTANCE AND CAPACITANCE

(71) Applicant: VIA Telecom, Inc., San Diego, CA (US)

(72) Inventors: Hsien-Ku Chen, New Taipei (TW);
Bing-Jye Kuo, New Taipei (TW);
Fang-Ren Liao, New Taipei (TW);
Pei-Wei Chen, New Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/017,391

(22) Filed: Sep. 4, 2013

(65) Prior Publication Data
US 2014/0152394 A1    Jun. 5, 2014

(30) Foreign Application Priority Data
Dec. 4, 2012    (CN) .......................... 2012 1 0512819

(51) Int. Cl.
*G01R 35/00* (2006.01)
*G01R 31/02* (2006.01)
*G01R 31/06* (2006.01)
*G01R 31/28* (2006.01)

(52) U.S. Cl.
CPC .............. *G01R 35/00* (2013.01); *G01R 35/005* (2013.01); *G01R 31/028* (2013.01); *G01R 31/06* (2013.01); *G01R 31/2822* (2013.01)

(58) Field of Classification Search
CPC ........... H03B 5/04; H03G 3/30; G01R 31/028
USPC ............. 331/117 R, 167; 330/284; 455/127.2
See application file for complete search history.

(56) References Cited

U.S. PATENT DOCUMENTS

| | | | |
|---|---|---|---|
| 7,221,924 B2 * | 5/2007 | Zheng et al. .................... | 455/307 |
| 2011/0275341 A1 * | 11/2011 | Landmark et al. ............. | 455/318 |
| 2013/0281042 A1 * | 10/2013 | Wang et al. .................... | 455/311 |
| 2013/0295863 A1 * | 11/2013 | Shanan ........................ | 455/226.2 |
| 2014/0120853 A1 * | 5/2014 | Laskar ........................ | 455/127.2 |

* cited by examiner

*Primary Examiner* — Jeffrey Shin
(74) *Attorney, Agent, or Firm* — Schiff Hardin LLP (57) ABSTRACT

A frequency detection circuit includes a filter, a power detector and a voltage comparator. The filter receives and filters a converted signal to generate a filtered signal. The power of the filtered signal relates to a frequency of the converted signal. The power detector generates a voltage according to the power of the filtered signal. The voltage comparator compares the voltage with multiple reference voltages to generate multiple comparison results. At least one of the inductance and capacitance of an LC tank in an amplifier is adjusted according to the comparison results.

14 Claims, 7 Drawing Sheets

FREQUENCY DETECTION CIRCUITS, RADIO FREQUENCY SIGNAL PROCESSING DEVICES AND METHODS FOR CALIBRATING INDUCTANCE AND CAPACITANCE

CROSS REFERENCE TO RELATED APPLICATIONS

This application claims priority of China Patent Application No. 201210512819.7, filed on Dec. 4, 2012, the entirety of which is incorporated by reference herein.

BACKGROUND OF THE INVENTION

1. Field of the Invention

The invention relates to a method and circuit for calibrating inductance and capacitance, and more particularly, to a method and circuit for calibrating inductance and capacitance by using an image rejection filter to compensate for process variations.

2. Description of the Related Art

Passive components that are used in Radio Frequency (RF) Integrated Circuits (ICs) typically have relatively large process variations. This leads to a direct trade-off between the accuracy of the resonant or resonance frequency and the bandwidth of the circuit.

As a result it is common practice to use relatively low-quality (or called low-Q) resonators in the RF signal path in order to ensure a sufficiently wide bandwidth and, thus, sufficient performance without requiring calibration.

However, the method as described above is not suitable for low bandwidth applications. For example, in the fields of global positioning system (GPS) or Bluetooth communications, because the system operation bandwidth is small, a low bandwidth amplifier is used. Therefore, in low bandwidth applications, high-quality designs are adopted to suppress the out-band spur while achieving low power consumption at the same time.

Accordingly, in low bandwidth systems, a novel method and circuit for calibrating inductance and capacitance to accurately detect the frequency drift caused by process variations and effectively calibrate the inductance and capacitances so as to compensate for the frequency drift caused by process variations are highly required.

BRIEF SUMMARY OF THE INVENTION

Frequency detection circuits, radio frequency signal processing devices and methods for calibrating inductance and capacitance are provided. An exemplary embodiment of a frequency detection circuit comprises a filter, a power detector and a voltage comparator. The filter receives and filters a converted signal to generate a filtered signal. A power of the filtered signal relates to a frequency of the converted signal. The power detector is coupled to the filter for generating a voltage according to the power of the filtered signal. The voltage comparator compares the voltage with a plurality of reference voltages to generate a plurality of comparison results. At least one of an inductance and a capacitance of an LC tank in an amplifier is adjusted according to the comparison results.

An exemplary embodiment of a radio frequency signal processing device comprises a low-noise amplifier, a mixer and a frequency detection circuit. The low-noise amplifier comprises an LC tank, an amplifier circuit, a cross-coupled transistor pair and a current source. The amplifier circuit is coupled to the LC tank at a pair of differential output terminals. The cross-coupled transistor pair is couple to the LC tank at the pair of differential output terminals. The current source is coupled to the cross-coupled transistor pair. The cross-coupled transistor pair, the LC tank and the current source form a self-oscillation circuit for generating an oscillating signal oscillating at an oscillating frequency according to an inductance and a capacitance of the LC tank. The mixer down-converts the oscillating signal according to a desired frequency to generate a converted signal. The frequency detection circuit is coupled to the low-noise amplifier and the mixer for detecting a frequency of the converted signal and generating a calibration signal according to the frequency. At least one of the inductance and the capacitance of the LC tank is adjusted according to the calibration signal.

An exemplary embodiment of a method for calibrating inductance and capacitance comprises: generating an oscillating signal oscillating at an oscillating frequency via an LC tank; frequency down-converting the oscillating signal according to a desired frequency to generate a converted signal; filtering the converted signal according to a predetermined frequency response to generate a filtered signal, wherein a power of the filtered signal relates to a frequency of the converted signal; generating a calibration signal according to the power; and adjusting at least one of an inductance and a capacitance of the LC tank according to the calibration signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
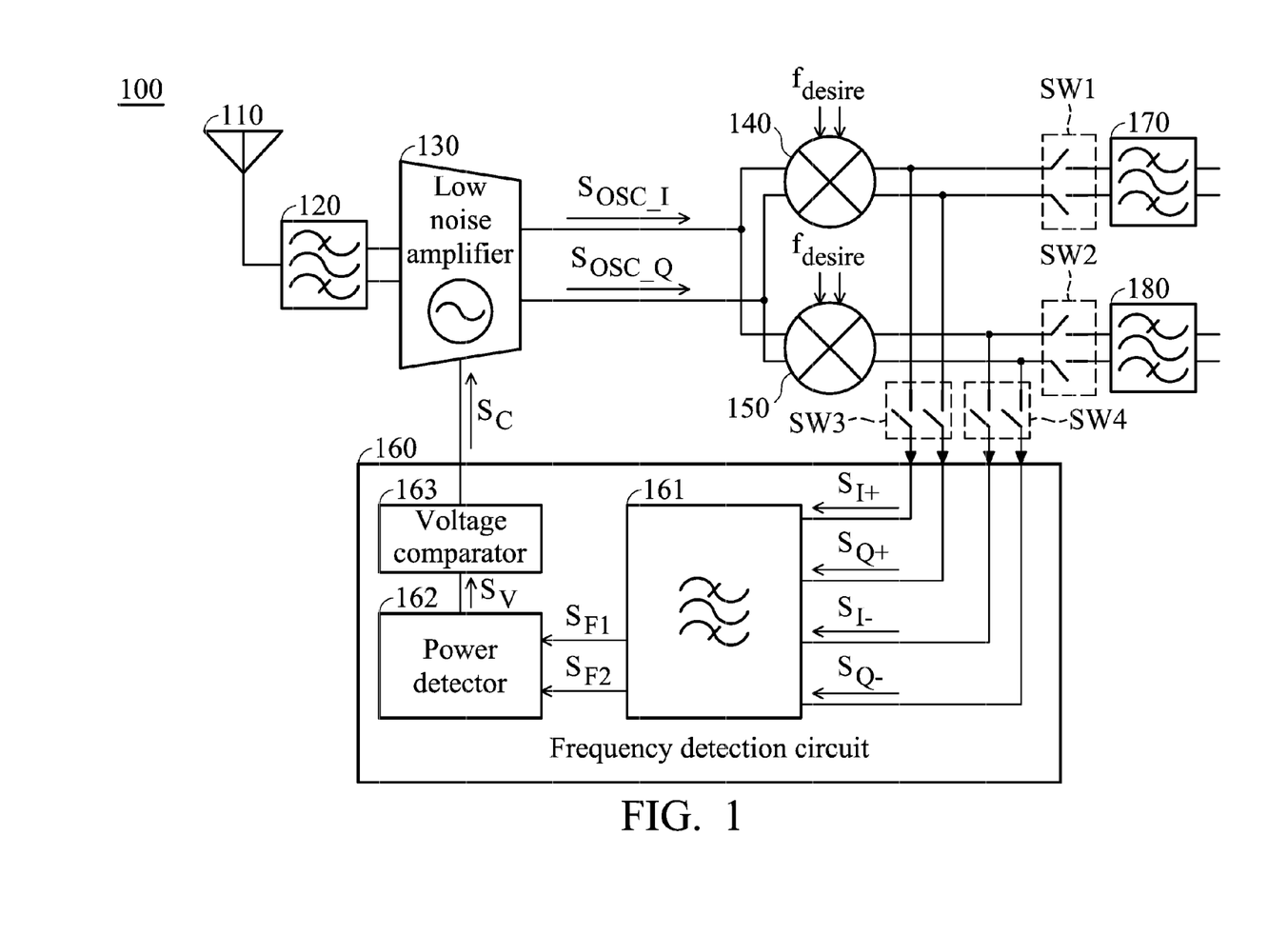
FIG. 1 shows a block diagram of an RF signal processing device according to an embodiment of the invention.

FIG. 1 shows a block diagram of an RF signal processing device according to an embodiment of the invention. As shown in FIG. 1, the RF signal processing device 100 may comprise an antenna 110, a low-noise amplifier 130, mixers 140 and 150, a frequency detection circuit 160 and filters 120, 170 and 180. According to an embodiment of the invention, the RF signal processing device 100 may operate in a receiving mode and a calibration mode. When operating in the receiving mode, RF signals are received from the air interface via the antenna 110, filtered by the filter 120 and then passed to the low-noise amplifier 130. According to a preferred embodiment of the invention, the RF signals are separated into the in-phase (I) components and the quadrature-phase (Q) components after being filtered by the filter 120, which benefits subsequent signal processing. However, it should be noted that based on different system designs, in the other embodiments of the invention, the RF signals may also not be separated into the in-phase (I) components and the quadrature-phase (Q) components after being filtered by the filter 120. Therefore, the invention should not be limited to the embodiment as shown in FIG. 1.

After filtering, the low-noise amplifier 130 amplifies the filtered RF signals and outputs the amplified RF signals to the mixers 140 and 150. The mixers 140 and 150 frequency down-convert the amplified RF signals according to a desired frequency $f_{desire}$, so as to generate intermediate frequency signals or baseband signals. According to an embodiment of the invention, the mixers 140 and 150 may receive a signal oscillating at the desired frequency $f_{desire}$ from a frequency synthesizer, and a value of the desired frequency $f_{desire}$ may be different in the receiving mode and the calibration mode. For example, suppose that the RF signal processing device 100 is an RF signal processing device for a GPS, the value of the desired frequency $f_{desire}$ may be set to 1571.328 MHz in the receiving mode and set to 1575.42 MHz in the calibration mode.

According to an embodiment of the invention, when operating in the receiving mode, the switches SW3 and SW4 are opened and the switches SW1 and SW2 are closed, such that the mixers 140 and 150 are respectively coupled to the filters 170 and 180 in the receiving mode and the intermediate frequency signals or baseband signals are filtered via the filters 170 and 180 before being provided to the next stage circuit (not shown) for subsequent signal processing. On the other hand, when operating in the calibration mode, the switches SW1 and SW2 are opened and the switches SW3 and SW4 are closed, such that the mixers 140 and 150 are coupled to the frequency detection circuit 160. The frequency detection circuit 160 generates a calibration signal $S_C$ according to the signals outputted by the mixers 140 and 150 and feeds the calibration signal $S_C$ back to the low-noise amplifier 130 for calibrating the frequency drift caused by process variation. The circuits and methods for calibrating inductance and capacitance are further illustrated in the following paragraphs.

Figure 2:
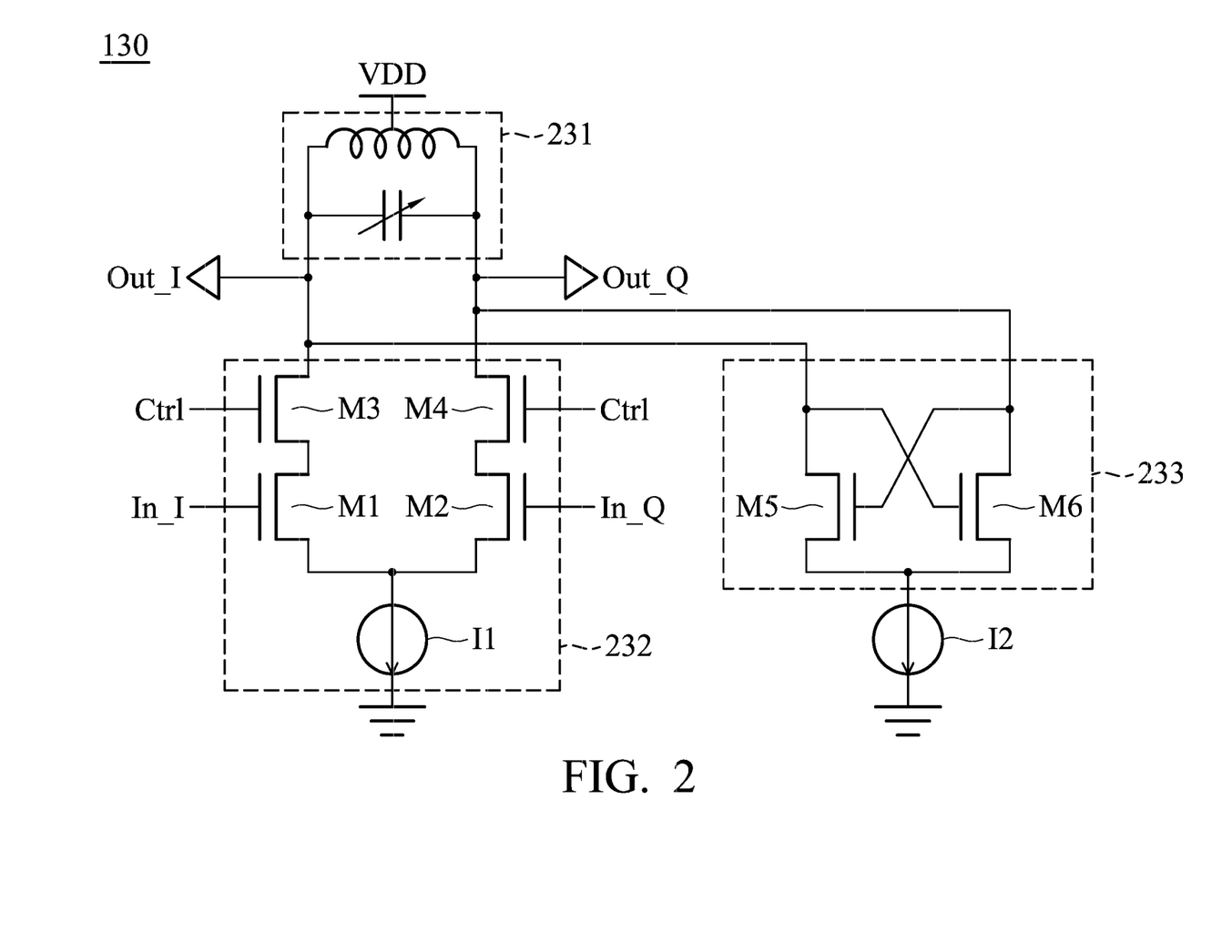
FIG. 2 shows a circuit diagram of a low-noise amplifier according to an embodiment of the invention.

FIG. 2 shows a circuit diagram of a low-noise amplifier according to an embodiment of the invention. The low-noise amplifier 130 may comprise an LC tank 231, an amplifier circuit 232, a cross-coupled transistor pair 233 and a current source 12. The amplifier circuit 232 and the LC tank 231 are coupled at a pair of differential output terminals Out_I and Out_Q. The cross-coupled transistor pair 233 and the LC tank 231 are also coupled at the pair of differential output terminals Out_I and Out_Q. When the RF signal processing device operates in the receiving mode, the current source I1 in the amplifier circuit 232 is enabled and the pair of transistors M3 and M4 are turned on in response to the control signal Ctrl, such that the amplifier circuit 232 is enabled and the amplifier circuit 232 and the LC tank 231 together form a low-noise amplifier circuit. The transistor pair M1 and M2 in the low-noise amplifier circuit receives the RF signals at a pair of differential input terminals In_I and In_Q and amplifies the RF signals. Note that in the receiving mode, the current source 12 is disabled such that the current source 12, so that the cross-coupled transistor pair 233 does not affect operations of the low-noise amplifier circuit.

On the other hand, when the RF signal processing device operates in the calibration mode, the current source 12 is enabled such that the cross-coupled transistor pair 233, the LC tank 231 and the current source 12 form a self-oscillation circuit to generate a pair of differential oscillating signals (as the oscillating signals $S_{OSC\_I}$ and $S_{OSC\_Q}$ shown in FIG. 1) oscillating at a oscillating frequency according to an inductance and a capacitance of the LC tank 231. Note that in the calibration mode, the current source I1 in the amplifier circuit 232 is disabled such that the amplifier circuit 232 is disabled and the pair of transistors M3 and M4 are turned off in response to the control signal Ctrl for preventing the oscillating signals from feeding into the input terminals In_I and In_Q via the pair of transistors M1 and M2 to affect the other stages of circuits.

According to a preferred embodiment of the invention, the RF signal processing device may first operate in the calibration mode for calibrating the frequency drift caused by process variation in the passive devices (for example, the inductors and the capacitors in the LC tank 231) in the RF signal processing device. After calibration, the RF signal processing device operates in the receiving mode for receiving and processing the RF signals according to the calibrated inductance and/or capacitance. In this manner, the performance degradation of the RF signal processing due to the frequency drift can be reduced.

Referring back to FIG. 1, as discussed above, in the calibration mode, the low-noise amplifier 130 may first generate the oscillating signals $S_{OSC\_I}$ and $S_{OSC\_Q}$ through the LC tank 231. The mixers 140 and 150 frequency down-convert the oscillating signals $S_{OSC\_I}$ and $S_{OSC\_Q}$ according to the desired frequency $f_{desire}$ to generate a plurality of converted signals. In the embodiment, the converted signals may comprise the 0-degree signal $S_{I+}$, 90-degree signal $S_{Q+}$, 180-degree signal $S_{I-}$ and 270-degree signal $S_{Q-}$.

The frequency detection circuit 160 may be coupled to the mixers 140 and 150 and the low-noise amplifier 130 for detecting a frequency of the converted signals and generate the calibration signal $S_C$ according to the frequency. According to an embodiment, the frequency detection circuit 160 may comprise a filter 161, a power detector 162 and a voltage comparator 163. The filter 161 may receive and filter converted signals to generate filtered signals $S_{F1}$ and $S_{F2}$. According to an embodiment of the invention, the filter 161 may be selected as an image rejection filter (IMRF) for filtering the converted signals according to a predetermined frequency response such that a power of the filtered signals $S_{F1}$ and $S_{F2}$ relates to a frequency of the converted signals.

Figure 3:
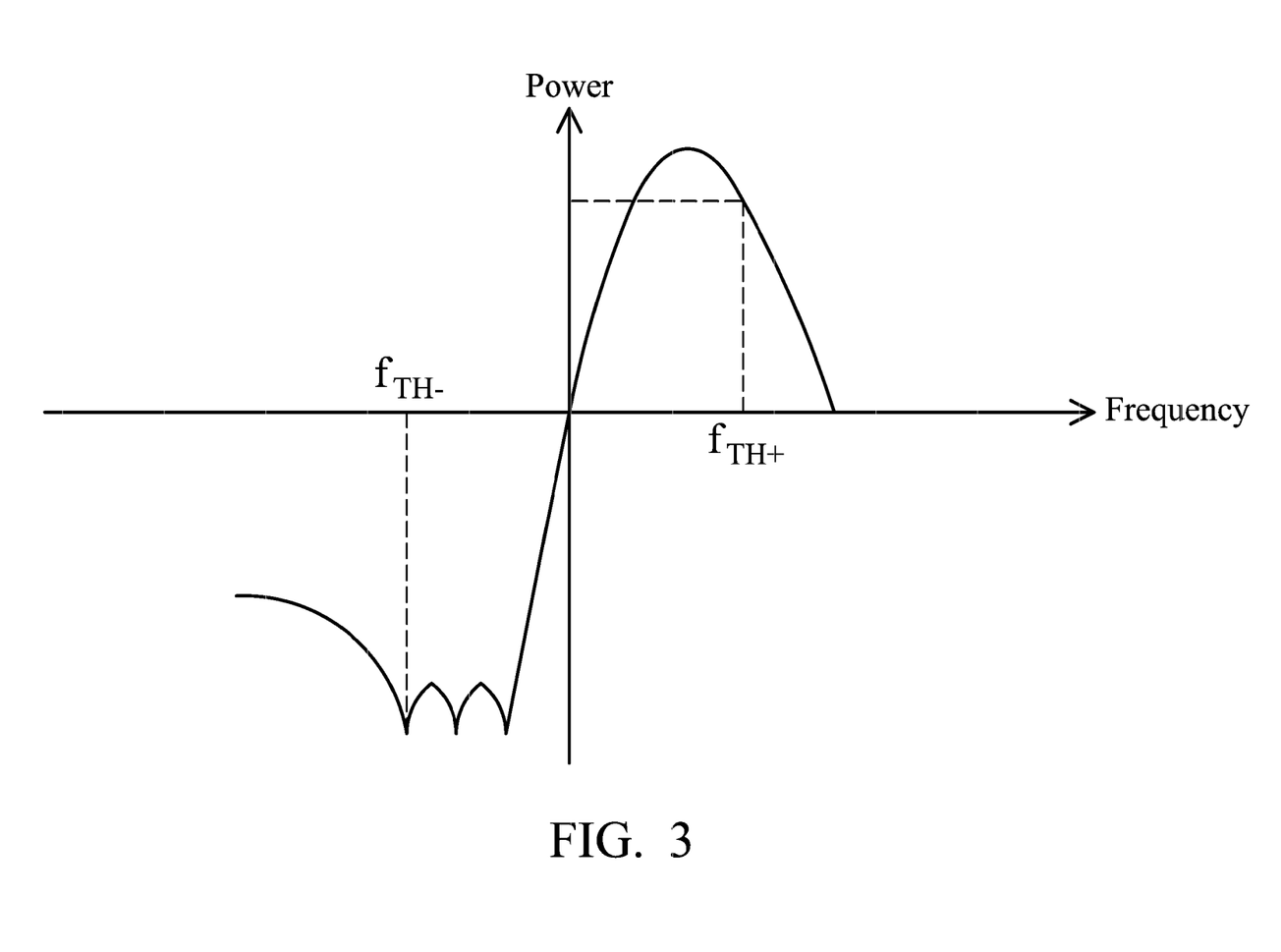
FIG. 3 is a diagram showing an exemplary frequency response according to an embodiment of the invention.

FIG. 3 is a diagram showing an exemplary frequency response according to an embodiment of the invention. As shown in FIG. 3, when the frequency of the input signal does not exceed a predetermined range (for example, between the frequency thresholds $f_{TH+}$ and $f_{TH-}$), the power of the output signal is proportional to the frequency of the input signal. Since the input signals are the signals generated by frequency down-converting the oscillating signals $S_{OSC\_I}$ and $S_{OSC\_Q}$ via the mixers 140 and 150, when the desired frequency $f_{desire}$ is designed as the transmission frequency required by the communication system (for example, the 1575.42 MHz for GPS system as discussed above), the power of the signals outputted by the filter 161 reflects the frequency drift due to process variation.

For example, when the oscillating frequency $f_{OSC}$ of the oscillating signal generated by the LC tank 231 is about the desired frequency $f_{desire}$, it means that the frequency drift caused by the process variation is about 0 Hz. Therefore, the frequency of the signals after being frequency down-converted by the mixers 140 and 150 is about 0 Hz. Similarly, when the oscillating frequency $f_{OSC}$ of the oscillating signal generated by the LC tank 231 is greater than the desired frequency $f_{desire}$, it means that the frequency drift caused by the process variation is greater than 0 Hz. Therefore, the frequency of the signals after being frequency down-converted by the mixers 140 and 150 is positive. When the oscillating frequency $f_{OSC}$ of the oscillating signal generated by the LC tank 231 is smaller than the desired frequency $f_{desire}$, it means that the frequency drift caused by the process variation is smaller than 0 Hz. Therefore, the frequency of the signals after being frequency down-converted by the mixers 140 and 150 is negative.

As shown in FIG. 3, when the frequency of the input signal is between the frequency thresholds $f_{TH+}$ and $f_{TH-}$, the power of the output signal increases as the frequency of the input signal increases. Therefore, the power of the output signal reflects the amount of frequency drift caused by the process variation. Note that the frequency response as shown in FIG. 3 is just one of a plurality of embodiments of the invention. Those who are skilled in this technology can still design different frequency responses according to different system requirements based on the concept of this invention, such that different relationships may be generated between the frequency of the input signal and the power of the output signal and/or the frequency thresholds may also have different values. Therefore, the invention should not be limited to the embodiment as shown in FIG. 3.

Figure 4:
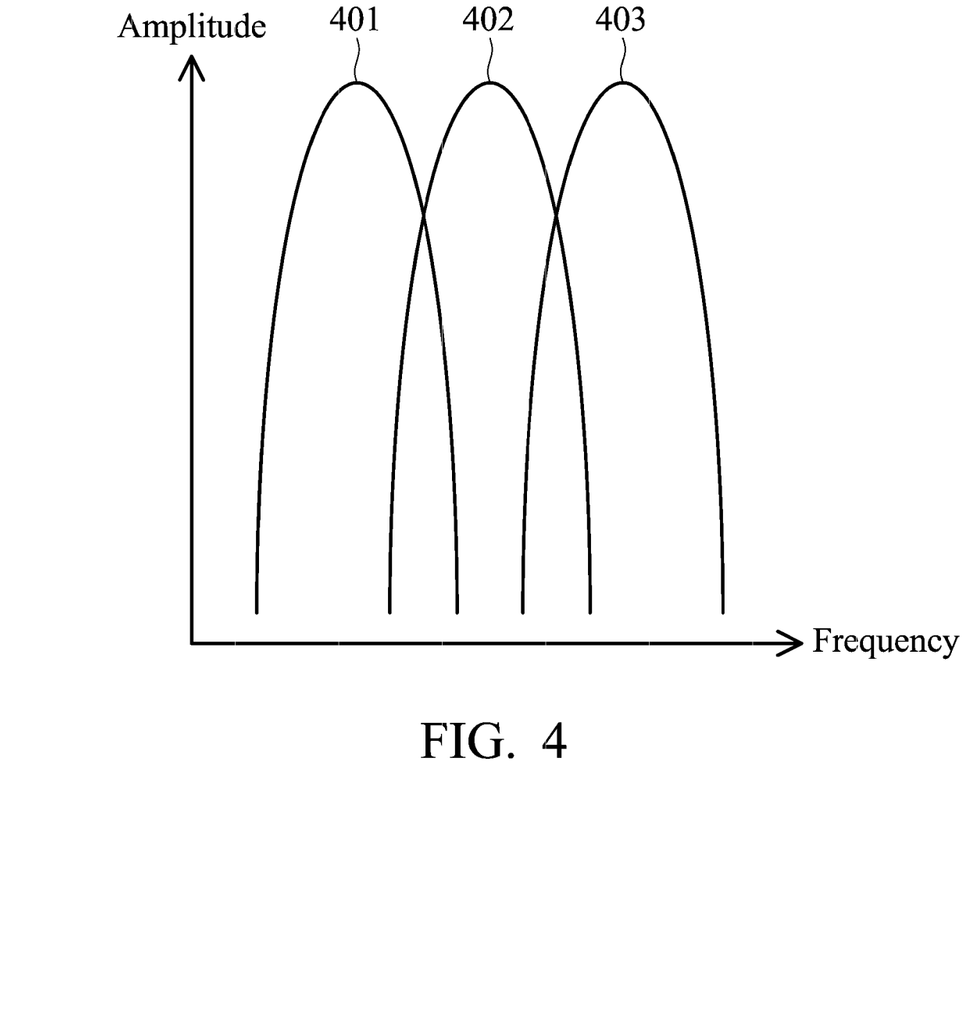
FIG. 4 is a schematic diagram showing frequency drift of a low-noise amplifier according to an embodiment of the invention.

FIG. 4 is a schematic diagram showing frequency drift of a low-noise amplifier according to an embodiment of the invention. As shown in FIG. 4, the curves 401~403 shows the possible frequency responses of the low-noise amplifier, where the curve 402 is an ideal frequency response when there is no process variation (that is, the typical-typical (TT) process corner), the curve 401 is a frequency response in the slow-slow (SS) process corner, and the curve 403 is a frequency response in the fast-fast (FF) process corner. As shown in FIG. 4, in the FF process corner, the operation band of the low-noise amplifier is in the high frequency area and in the SS process corner, the operation band of the low-noise amplifier is in the low frequency area.

Therefore, according to a concept of the invention, in the calibration mode, the oscillating signals are generated via the self-oscillation circuit in the low-noise amplifier. The oscillating signals are next frequency down-converted via the mixers 140 and 150 and the converted signals are filtered by the filter 161. The power of the filtered signals reflects whether the operation band of the low-noise amplifier is close to the high frequency area or the low frequency area due to process variation, and further reflects the amount of frequency drift.

Figure 5:
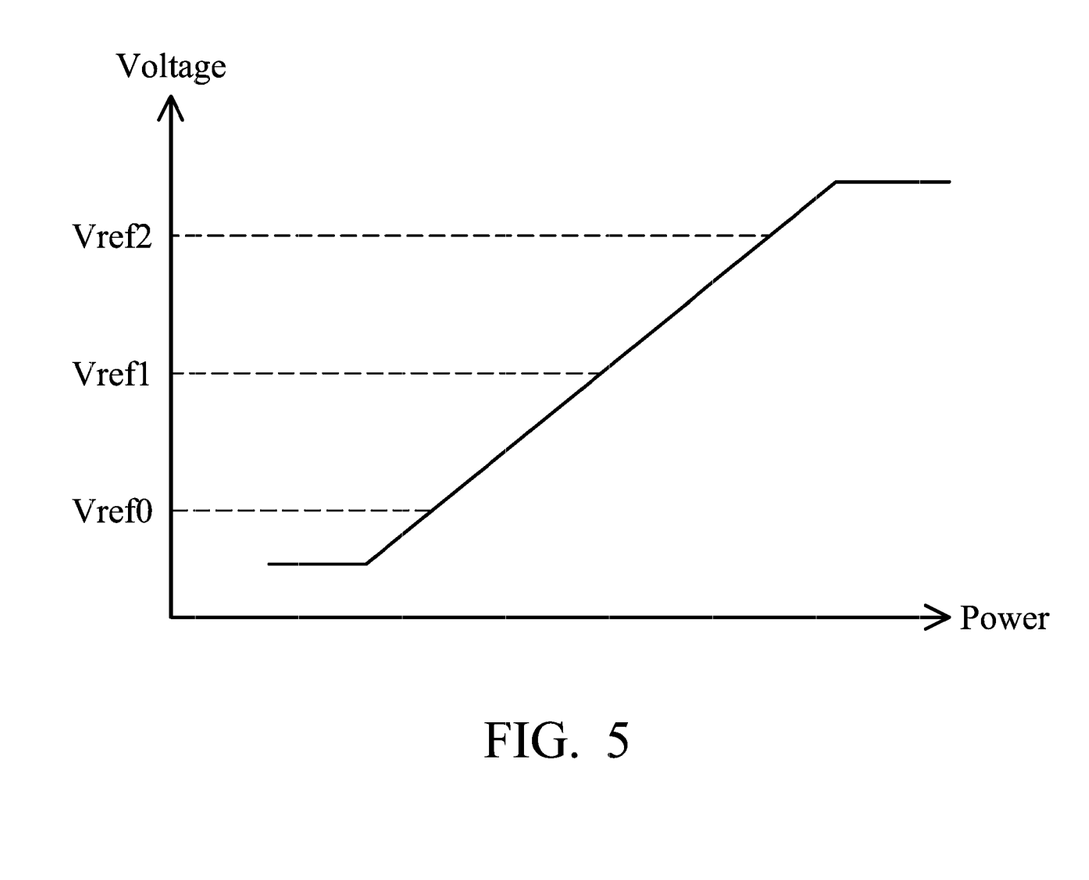
FIG. 5 is a schematic diagram showing the power to voltage conversion according to an embodiment of the invention.

After filtering, the power detector 162 transfers the power of the filtered signals $S_{F1}$ and $S_{F2}$ into the corresponding voltage. FIG. 5 is a schematic diagram showing the power to voltage conversion according to an embodiment of the invention. As shown in FIG. 5, the power of the input signal may have a corresponding voltage value, and the voltage signal $S_V$ generated by the power detector 162 is transmitted to the voltage comparator 163 to be compared with a plurality of reference voltages (such as the reference voltages Vref0, Vref1 and Vref2).

Figure 6:
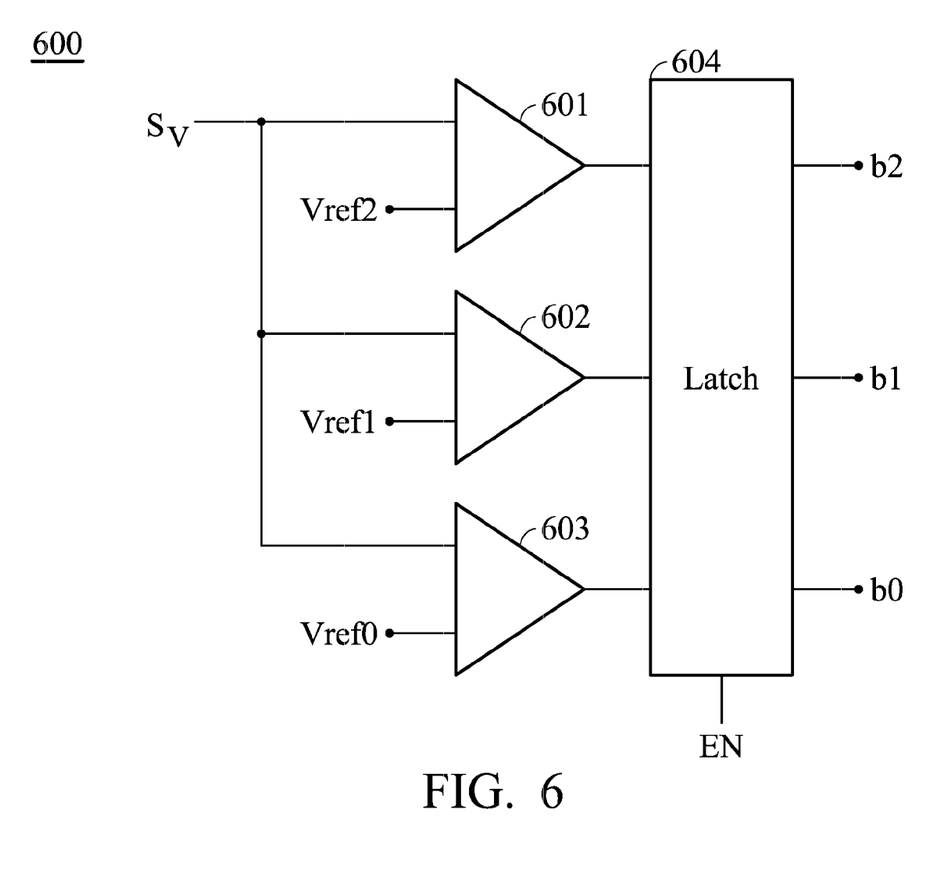
FIG. 6 shows a circuit diagram of a voltage comparator according to an embodiment of the invention.

FIG. 6 shows a circuit diagram of a voltage comparator according to an embodiment of the invention. According to an embodiment of the invention, the voltage comparator 600 may comprise a plurality of comparators, such as the comparators 601, 602 and 603, for respectively comparing the voltage of the voltage signal $S_V$ with one of the reference signals Vref0, Vref1 and Vref2, to generate a plurality of comparison results.

According to an embodiment of the invention, the comparison results may be represented by bits, such as the bits b0, b1 and b2 as shown. The voltage comparator 600 may comprise a latch 604 for receiving and latching the comparison results and outputting the comparison results as the calibration signal $S_C$ at adequate times in response to the enable signal EN. The calibration signal $S_C$ is fed back to the low-noise amplifier 130 so as to adjust at least one of the inductance and the capacitance of the LC tank 231.

According to an embodiment of the invention, the LC tank 231 may comprise a plurality of capacitors that are selectively coupled in parallel for adjusting the capacitance according to the calibration signal $S_C$. Table 1 shows an example of capacitance adjustment according to an embodiment of the invention.

TABLE 1 capacitance adjustment example

| b2 | b1 | b0 | C1 C0 |
|----|----|----|-------|
| 1  | 1  | 1  | 1 1   |
| 0  | 1  | 1  | 0 1   |
| 0  | 0  | 1  | 0 0   |
| 0  | 0  | 0  | 0 0   |

As shown in Table 1, in the example, the LC tank 231 may comprise three capacitors coupled in parallel and the calibration signal $S_C$ may carry two-bits of data. The bits C1 and C0 are the results obtained by performing logic operations on the bits b0, b1 and b2 (for example, the logic operations may be performed inside of the latch 604). For example, when the voltage signal $S_V$ is smaller than the reference signals Vref0, Vref1 and Vref2, the obtained comparison results may all be 0, and the resulting bits C1 and C0 may all be 0. Therefore, two capacitors in the LC tank 231 may be controlled to be de-coupled from the inductor such that the overall capacitance is adjusted. For another example, when the voltage signal $S_V$ is greater than the reference signals Vref0, Vref1 and Vref2, the obtained comparison results may all be 1, and the resulting bits C1 and C0 may all be 1. Therefore, all the capacitors in the LC tank 231 may be controlled to be coupled to the inductor such that the overall capacitance is adjusted.

Note that the capacitance adjusting method as illustrated above is just one of a plurality of embodiments of the invention. Those who are skilled in this technology can still adjust the capacitance and/or inductance of the LC tank 231 in different ways based on the concept illustrated above, and the invention should not be limited thereto.

Figure 7:
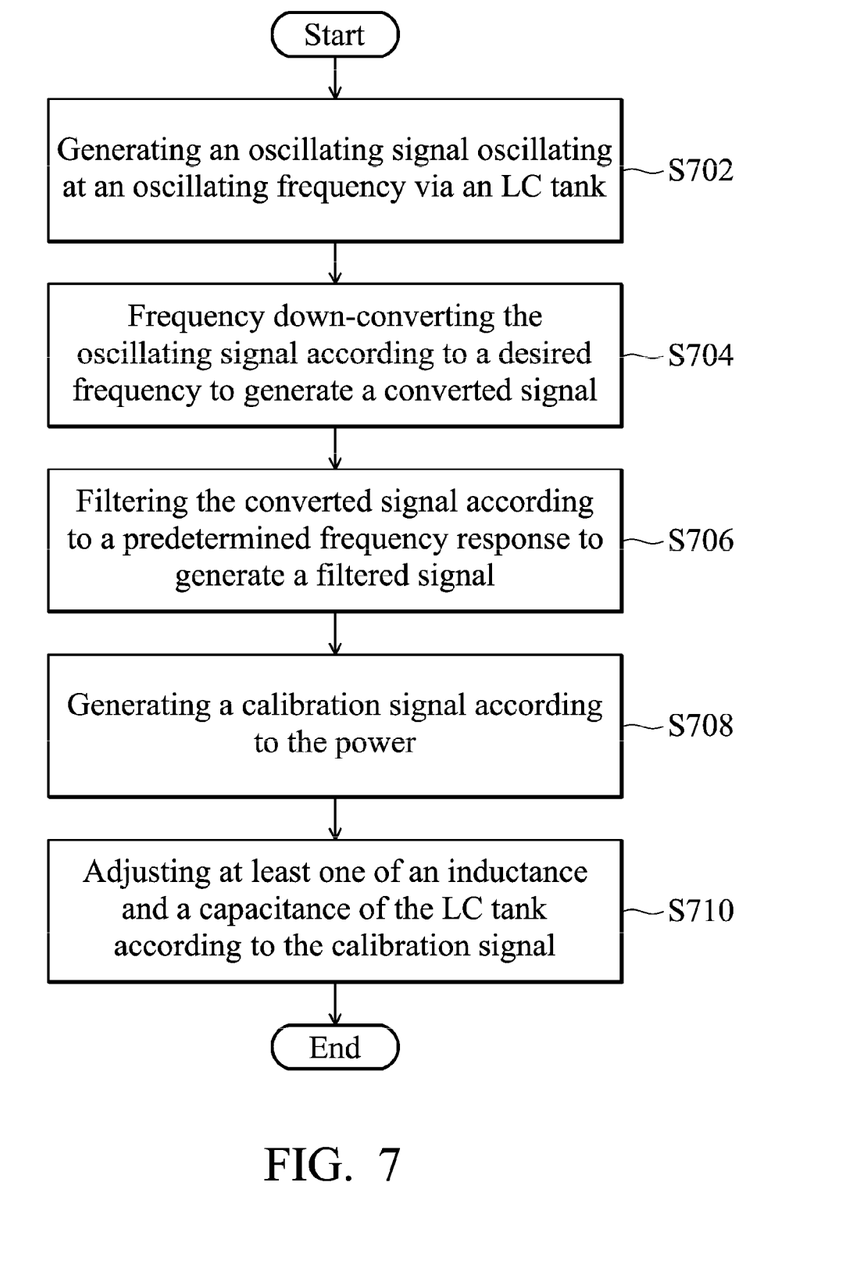
FIG. 7 shows a flow chart of a method for calibrating inductance and capacitance according to an embodiment of the invention.

FIG. 7 shows a flow chart of a method for calibrating inductance and capacitance according to an embodiment of the invention. First of all, an oscillating signal oscillating at an oscillating frequency is generated via an LC tank (Step S702). Next, the oscillating signal is frequency down-converted according to a desired frequency to generate a converted signal (Step S704). Next, the converted signal is filtered according to a predetermined frequency response to generate a filtered signal (Step S706), such that a power of the filtered signal relates to a frequency of the converted signal. Next, a calibration signal is generated according to the power (Step S708). Finally, at least one of an inductance and a capacitance of the LC tank is adjusted according to the calibration signal (Step S710).

The proposed methods for calibrating inductance and capacitance can effectively compensate for the frequency drift caused by process variation via inductance and/or capacitance calibration, such that the performance of RF signal processing will not degrade due to frequency drift. In addition, the proposed circuits and methods for calibrating inductance and capacitance have the advantages of having a small circuit area and low power consumption as compared with the conventional designs.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A frequency detection circuit, comprising:
   a filter, receiving a converted signal and filtering the converted signal according to a predetermined frequency response to generate a filtered signal, wherein a power of the filtered signal relates to a frequency of the converted signal;
   a power detector, coupled to the filter for generating a voltage according to the power of the filtered signal; and
   a voltage comparator, comparing the voltage with a plurality of reference voltages to generate a plurality of comparison results,
   wherein at least one of an inductance and a capacitance of an LC tank in an amplifier is adjusted according to the comparison results in a calibration mode, wherein the amplifier operates in at least the calibration mode and a receiving mode, and in the calibration mode, an amplifier circuit of the amplifier is disabled and a current source of the amplifier is enabled such that a cross-coupled transistor pair of the amplifier, the LC tank and the current source form a self-oscillation circuit for generating an oscillating signal.

2. The frequency detection circuit as claimed in claim 1, wherein the filter is an image rejection filter.

3. The frequency detection circuit as claimed in claim 1, wherein the converted signal is generated by frequency down-converting the oscillating signal oscillating at an oscillating frequency according to a desired frequency, and the LC tank is utilized to generate the oscillating signal.

4. The frequency detection circuit as claimed in claim 1, wherein the voltage comparator comprises a plurality of comparators for comparing the voltage with one of the reference voltages to generate the comparison results.

5. A radio frequency signal processing device, comprising:
   a low-noise amplifier, comprising:
   an LC tank;
   an amplifier circuit, coupled to the LC tank at a pair of differential output terminals;
   a cross-coupled transistor pair, couple to the LC tank at the pair of differential output terminals; and
   a current source, coupled to the cross-coupled transistor pair,
   wherein the cross-coupled transistor pair, the LC tank and the current source form a self-oscillation circuit for generating an oscillating signal oscillating at an oscillating frequency according to an inductance and a capacitance of the LC tank;
   a mixer, down-converting the oscillating signal according to a desired frequency to generate a converted signal; and
   a frequency detection circuit, coupled to the low-noise amplifier and the mixer for detecting a frequency of the converted signal and generating a calibration signal according to the frequency,
   wherein at least one of the inductance and the capacitance of the LC tank is adjusted according to the calibration signal, and
   wherein the low-noise amplifier operates in at least a calibration mode and a receiving mode, and in the calibration mode, the amplifier circuit is disabled and the current source is enabled such that the cross-coupled transistor pair, the LC tank and the current source form the self-oscillation circuit for generating the oscillating signal.

6. The radio frequency signal processing device as claimed in claim 5, wherein the frequency detection circuit further comprises:
   a power detector, coupled to the filter for generating a voltage according to the power of the filtered signal; and
   a voltage comparator, comparing the voltage with a plurality of reference voltages to generate the calibration signal.

7. The radio frequency signal processing device as claimed in claim 5, wherein the filter is an image rejection filter.

8. The radio frequency signal processing device as claimed in claim 6, wherein the voltage comparator comprises a plurality of comparators for respectively comparing the voltage with one of the reference voltages to generate a plurality of comparison results and generate the calibration signal according to the comparison results.

9. The radio frequency signal processing device as claimed in claim 5, wherein in the receiving mode, the current source is disabled and the amplifier circuit is enabled such that the amplifier circuit and the LC tank form a low-noise amplifier circuit for amplifying a received radio frequency signal.

10. A method for calibrating inductance and capacitance, comprising:
    generating an oscillating signal oscillating at an oscillating frequency via an LC tank of a low noise amplifier, wherein the low-noise amplifier operates in at least a calibration mode and a receiving mode, and in the calibration mode, an amplifier circuit of the low noise amplifier is disabled and a current source of the low noise amplifier is enabled such that a cross-coupled transistor pair of the low noise amplifier, the LC tank and the current source form a self-oscillation circuit for generating the oscillating signal;
    frequency down-converting the oscillating signal according to a desired frequency to generate a converted signal;
    filtering the converted signal according to a predetermined frequency response to generate a filtered signal, wherein a power of the filtered signal relates to a frequency of the converted signal;
    generating a calibration signal according to the power; and
    adjusting at least one of an inductance and a capacitance of the LC tank according to the calibration signal.

11. The method as claimed in claim 10, wherein the LC tank is comprised in a low-noise amplifier.

12. The method as claimed in claim 11, wherein the step of generating the oscillating signal oscillating at the oscillating frequency via the LC tank is performed by a self-oscillation circuit comprised in the low-noise amplifier.

13. The method as claimed in claim 10, wherein the step of filtering the converted signal according to the predetermined frequency response is performed by an image rejection filter.

14. The method as claimed in claim 10, wherein the step of generating the calibration signal according to the power further comprises:
generating a voltage according to the power;
comparing the voltage with a plurality of reference voltages to generate a plurality of comparison results; and
generating the calibration signal according to the comparison results.

* * * * *